(12) United States Patent
Chen

(10) Patent No.: US 7,973,552 B2
(45) Date of Patent: Jul. 5, 2011

(54) ON-DIE TERMINATORS FORMED OF COARSE AND FINE RESISTORS

(75) Inventor: Chung-Hui Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/950,419

(22) Filed: Dec. 4, 2007

(65) Prior Publication Data

US 2009/0140765 A1    Jun. 4, 2009

(51) Int. Cl.
*H03K 17/16* (2006.01)
*H03K 19/003* (2006.01)

(52) U.S. Cl. .......................................... 326/30; 326/113
(58) Field of Classification Search ............... 326/30, 326/113
See application file for complete search history.

(56) References Cited

U.S. PATENT DOCUMENTS

| | | | | |
|---|---|---|---|---|
| 4,426,658 | A * | 1/1984 | Gontowski, Jr. ............... | 257/529 |
| 5,371,420 | A * | 12/1994 | Nakao ............................ | 326/27 |
| 5,457,407 | A * | 10/1995 | Shu et al. ....................... | 326/30 |
| 5,493,148 | A * | 2/1996 | Ohata et al. .................... | 257/538 |
| 5,656,524 | A * | 8/1997 | Eklund et al. .................. | 438/238 |
| 5,778,204 | A | 7/1998 | Van Brunt et al. | |
| 6,469,558 | B1 * | 10/2002 | Shepston et al. ............... | 327/278 |
| 6,586,964 | B1 * | 7/2003 | Kent et al. ....................... | 326/30 |
| 6,809,546 | B2 | 10/2004 | Song et al. | |
| 6,833,729 | B2 * | 12/2004 | Kim et al. ........................ | 326/30 |
| 6,836,142 | B2 * | 12/2004 | Lesea et al. ..................... | 326/30 |
| 6,847,225 | B2 | 1/2005 | Viehmann et al. | |
| 6,853,213 | B2 * | 2/2005 | Funaba ........................... | 326/30 |
| 6,859,064 | B1 * | 2/2005 | Maangat ......................... | 326/30 |
| 6,894,529 | B1 * | 5/2005 | Chong et al. ................... | 326/30 |
| 6,909,305 | B1 * | 6/2005 | Li et al. ........................... | 326/30 |
| 7,064,576 | B1 * | 6/2006 | Maangat ......................... | 326/30 |
| 7,068,078 | B2 * | 6/2006 | Yoo ................................. | 326/87 |
| 7,116,128 | B2 * | 10/2006 | Kubo .............................. | 326/30 |
| 7,148,720 | B2 * | 12/2006 | Chen .............................. | 326/30 |
| 7,205,787 | B1 * | 4/2007 | Massoumi et al. ............. | 326/30 |
| 7,230,449 | B2 * | 6/2007 | Dreps et al. .................... | 326/30 |
| 7,372,295 | B1 * | 5/2008 | Wei ................................ | 326/30 |
| 2005/0040845 | A1 * | 2/2005 | Park .............................. | 326/30 |
| 2007/0024317 | A1 * | 2/2007 | Hansen ......................... | 326/30 |
| 2007/0188187 | A1 * | 8/2007 | Oliva et al. ..................... | 326/30 |
| 2008/0074140 | A1 * | 3/2008 | Park .............................. | 326/30 |

* cited by examiner

*Primary Examiner* — Jason M Crawford
(74) *Attorney, Agent, or Firm* — Slater & Matsil, L.L.P.

(57) ABSTRACT

An integrated circuit includes a semiconductor substrate; a first node; a second node; and a first plurality of resistors, each in a first plurality of resistor units. Each of the first plurality of resistor units includes a first end connected to the first node, and a second end connected to the second node. The integrated circuit further includes a second plurality of resistors, each in a second plurality of resistor units. Each of the second plurality of resistor units includes a first end connected to the first node, and a second end connected to the second node. The first plurality of resistors is formed of a first material. The second plurality of resistors is formed of a second material different from the first material. The integrated circuit further includes a switch in one of the first and the second plurality of resistor units and serially connected to a resistor.

13 Claims, 4 Drawing Sheets

ON-DIE TERMINATORS FORMED OF COARSE AND FINE RESISTORS

TECHNICAL FIELD

This invention relates generally to semiconductor devices, and more particularly to on-die terminators for signal transmissions.

BACKGROUND

When data signals are communicated between circuit devices, reflection of the data signals occurs if the impedances of devices mismatch. Thus, an information signal exchange system requires a terminal resistor that terminates a signal transmission line, and the terminal resistor need to have an impedance matching the impedance of the signal transmission line. The terminal resistor suppresses the reflection of a received signal to raise the integrity of the transferred signals.

The terminal resistor may be located on the inside or outside of a semiconductor chip, which typically has integrated circuits for processing the data signals. The terminal resistor in a semiconductor chip is usually called an on-chip terminator, on-die terminator, or active terminator.

To be effectively used in a semiconductor chip, the on-chip terminator needs to be appropriately controlled according to an operation mode of the semiconductor chip, taken in consideration of power consumption and signal integrity. In other words, the on-die terminator should be controlled differently depending on whether the operation mode is an input mode, an output mode, or a power down mode. The resistance of the on-die terminator should thus be accordingly adjustable.

To obtain a desirable resistance, a plurality of resistors needs to be formed, and a control circuit is used to select resistors from the plurality of resistors and connecting the selected resistors to obtain a desirable resistance. The resulting resistance of the on-die terminator is determined by the number of the selected resistors, and their resistances.

Conventionally, there are two common types of resistors for forming on-die terminators. The first type of resistors is formed of polysilicon (poly) strips, which may be doped with a p-type or an n-type impurity. Polysilicon resistors have the advantageous feature of less prone to process variations, temperature variations, and voltage variations, which are in combination commonly referred to as PVT variations. Therefore, polysilicon resistors have smaller resistance variations from the designed values, typically around about 15 percent or less. However, the maximum currents per unit width that can be endured by polysilicon resistors are low, and hence polysilicon resistors typically occupy big chip areas.

Since polysilicon resistors are typically formed simultaneously with other devices in the same semiconductor chip, with the down-scaling of integrated circuits, polysilicon strips are becoming increasingly thinner, and hence the respective maximum endurable current decreases. However, the off-chip impedance stays the same, requiring the resistances of the on-die terminators to stay the same. As a result, polysilicon resistors need to occupy increasingly greater chip areas.

The other type of on-die terminators are formed of well regions, which may be doped with a p-type or an n-type impurity, typically an n-type impurity, and hence are commonly referred to as n-well resistors. N-well resistors may stand higher current per unit width, and hence can be made smaller. However, n-well resistors are prone to the PVT variations, and may have high resistance variations, for example, around about 50 percent. It is thus difficult to form precise on-die terminators using n-wells.

Existing on-die terminators cannot satisfy both the requirements of reduced chip area usage and high accuracy at the same time. Accordingly, new on-die terminators and methods for forming the same are needed.

SUMMARY OF THE INVENTION

In accordance with one aspect of the present invention, an integrated circuit includes a semiconductor substrate; a first node; a second node; and a first plurality of resistors, each in a first plurality of resistor units. Each of the first plurality of resistor units includes a first end connected to the first node, and a second end connected to the second node. The integrated circuit further includes a second plurality of resistors, each in a second plurality of resistor units. Each of the second plurality of resistor units includes a first end connected to the first node, and a second end connected to the second node. The first plurality of resistors is formed of a first material. The second plurality of resistors is formed of a second material different from the first material. The integrated circuit further includes a switch in one of the first and the second plurality of resistor units and serially connected to a resistor in a same resistor unit.

In accordance with another aspect of the present invention, an integrated circuit includes a semiconductor substrate; a first node; a second node; a plurality of well resistors in the semiconductor substrate, wherein each of the plurality of well resistors has a first end connected to the first node, and a second end; a first plurality of switches, each coupled between the second node and the second end of one of the plurality of well resistors; a plurality of polysilicon resistors, wherein each of the plurality of polysilicon resistors has a first end connected to the first node, and a second end; and a second plurality of switches, each coupled between the second node and the second end of one of the plurality of polysilicon resistors.

In accordance with yet another aspect of the present invention, an integrated circuit includes a semiconductor substrate; a first node; a second node; a well resistor in the semiconductor substrate, wherein the well resistor has a first end directly connected to the first node, and a second end directly connected to the second node; a plurality of polysilicon resistors, each of the plurality of polysilicon resistors having a first end connected to the first node, and a second end; and a plurality of switches, each coupled between the first end of one of the plurality of polysilicon resistors and the second node.

By forming on-die terminators using coarse and fine resistors, less chip area is used without sacrificing the accuracy of the resulting resistances. The embodiments of the present invention are also more scalable.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

To terminate a transmission line, an on-die terminator may be fabricated to have a same resistance (or impedance) as the transmission line. However, due to process variations, it is difficult to fabricate an on-die terminator having a precise resistance. Further, when the on-die terminator is used, the temperature and the voltage applied on the on-die terminator also causes the change in the resistance of the on-die terminator. The resistance variations caused by process variations, temperature variations, and voltages (referred to as PVT variations) need to be compensated for to generate a precise resistance.

Figure 1:
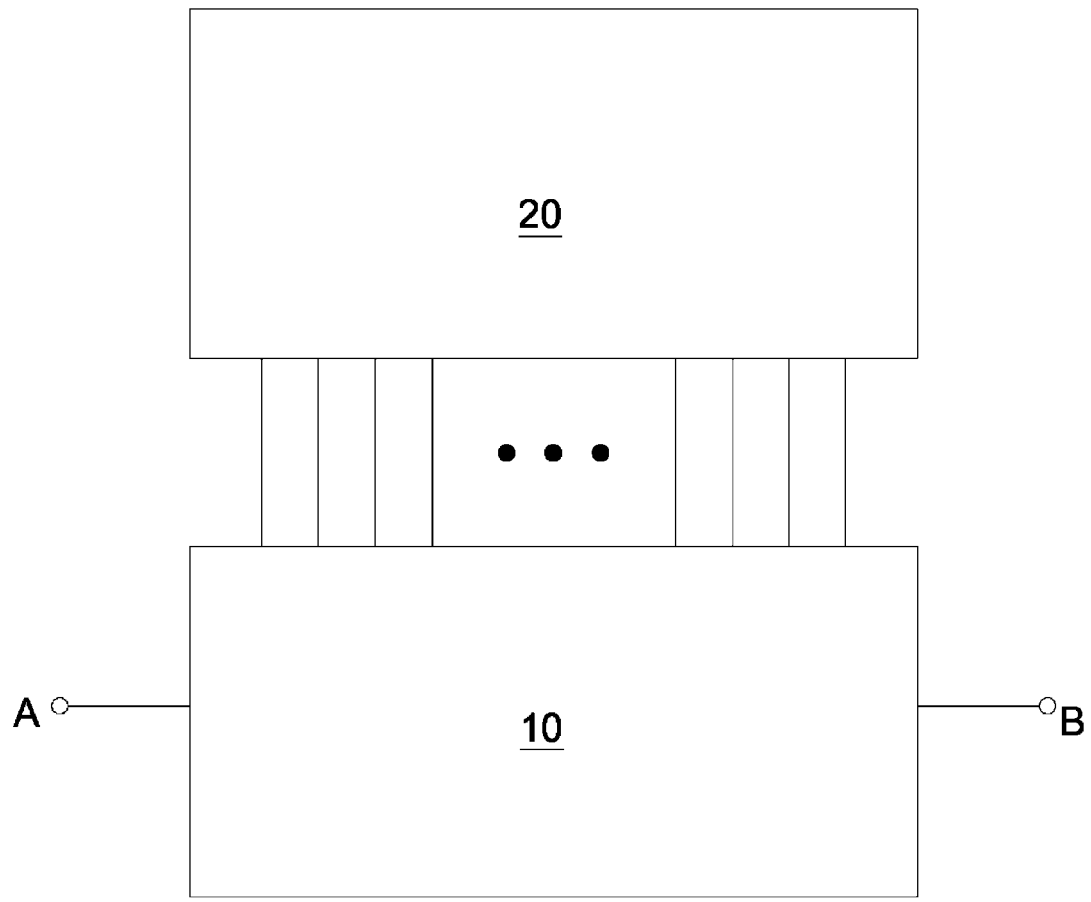
FIG. 1 illustrates a block diagram of an embodiment of the present invention.

FIG. 1 schematically illustrates a block diagram of an embodiment of the present invention. Resistor block 10, which includes a plurality of parallel-connected resistor units (not shown), is connected to, and controlled by, resistance compensation circuit 20. Resistance compensation circuit 20 has the function of selecting the connection of appropriate resistor units in resistor block 10, and connecting or disconnecting the selected resistor units, until the resistance of resistor block 10 is substantially close to the desirable resistance. Throughout the description, the resistance of the entire resistor block 10 is referred to as resistance $R_{A-B}$, which is the resistance between two terminal nodes A and B of resistor block 10. Resistor block 10 may be used as a line terminator, and the resistance of resistor block 10 is adjusted to match the line impedance of the signal transmission line, so that signal loss and reflection are minimized. For faster signal transmission and lower manufacturing cost, resistor block 10 is preferably formed on a semiconductor chip (die), and is thus an on-die terminator.

Figure 2:
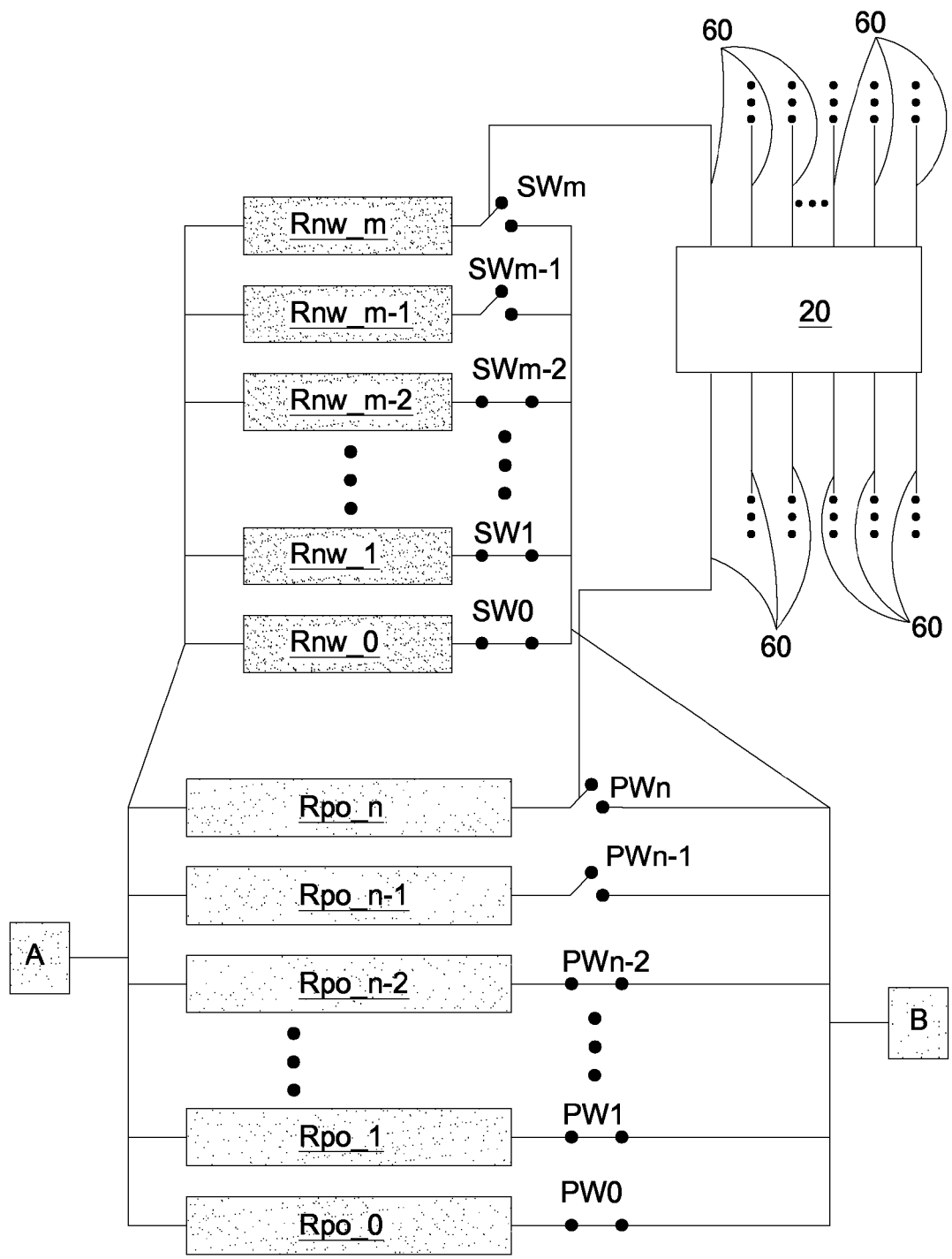
FIG. 2 illustrates a circuit diagram of an embodiment of the present invention, wherein a resistor block includes a plurality of polysilicon resistors and a plurality of well resistors.

FIG. 2 illustrates a circuit diagram of resistor block 10. A plurality of resistor units are formed between node A and node B, wherein the resistor units are connected parallel to each other. Each resistor unit includes a resistor and a switch that connects or disconnects the respective resistor in the same resistor unit.

The resistors in resistor block 10 include polysilicon resistors Rpo_0 through Rpo_n and well resistors Rnw_0 through Rnw_m, wherein each of the m and n is an integer greater than zero. Each of the resistor units includes one of the resistors and a switch, namely PW0 through PWn and SW0 through SWm. Polysilicon resistors Rpo_0 through Rpo_n are formed of polysilicon strips, which may be doped with a p-type impurity such as boron and/or indium, or an n-type impurity such as phosphorus and/or arsenic. Polysilicon resistors Rpo_0 through Rpo_n are each designed to have a target resistance. However, process variations, temperature variations, and voltage variations will cause their resistances to deviate from the respective target resistances. Advantageously, the resistance variations of polysilicon resistors are relatively small. Accordingly, polysilicon resistors Rpo_0 through Rpo_n are referred to as fine resistors.

Well resistors Rnw_0 through Rnw_n are formed of doped well regions in semiconductor substrates. Preferably, the well regions are doped with an n-type impurity such as arsenic, and thus the well resistors may be referred to as n-well resistors, although they can also be formed of p-well regions. Arsenic has relatively small diffusion length, and hence the corresponding depths of the well resistors are relatively less prone to the effects of thermal diffusion. Well resistors Rnw_0 through Rnw_n have higher resistance variations caused by the variations in processes, temperatures, and voltages than polysilicon resistors Rpo_0 through Rpo_n, and thus are referred to as coarse resistors.

Advantageously, the maximum endurable current per unit width (referred to as Imax/μm hereinafter) of well resistors is high, for example, about ten times higher than that of polysilicon resistors. On the other hand, the sheet resistance of well regions may be made comparable to that of polysilicon resistors, for example, with about 20 percent difference or less. It is known that the chip area of an on-chip resistor is proportional to $1/(\text{Rsheet}^2)*/((\text{Imax}/\mu m)^2)$, wherein Rsheet is the sheet resistance, and Imax/μm is the maximum endurable current per unit width. Accordingly, well resistors may occupy much smaller chip areas than polysilicon resistors having same resistances.

Figure 3:
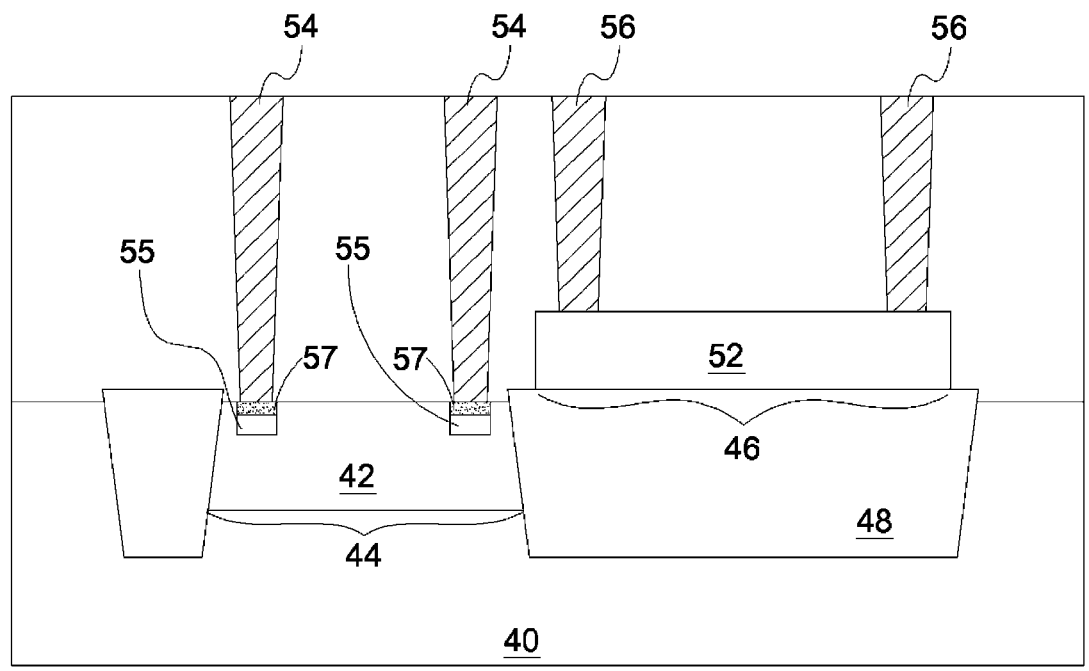
FIG. 3 illustrates a cross-sectional view of an exemplary polysilicon resistor and an exemplary well resistor.

FIG. 3 illustrates a cross-sectional view of exemplary well resistor 44 and polysilicon resistor 46. Well resistor 44 includes well region 42, preferably an n-well region, formed in semiconductor substrate 40. Alternatively, well region 42 is a p-well region, which is preferably formed in an additional n-well region (not shown). Contact plugs 54 are formed to connect to well region 42 through pickup regions 55 and silicide regions 57. Polysilicon resistor 46 may include polysilicon strip 52, which is connected to contact plugs 56. In the preferred embodiment, polysilicon strip 52 is formed simultaneously with, and thus has a same thickness as, polysilicon gates of transistors on the same chip. One skilled in the art will realize the formation processes of well resistors and polysilicon resistors.

Referring back to FIG. 2, switches PW0 through PWn and SW0 through SWm are coupled to, and controlled by, control lines 60 of resistance compensation circuit 20. In an exemplary embodiment, each of the switches PW0 through PWn and SW0 through SWm includes a transistor, and control lines 60 are connected to the gates of the transistors. One of the source/drain regions of each of the resistors is connected to a resistor while the other one is connected to node B. When a switch in a resistor block is turned on, the respective resistor in the same resistor unit is connected between nodes A and B. The total resistance Ra-b of resistor block 10 may then be expressed as:

$$Ra\text{-}b = Rsel1 // Rsel2 // Rsel3 \ldots // Rselp \quad \text{[Eq. 2]}$$

wherein resistors Rsel1 through Rselp represent all connected resistors. As one skilled in the art will realize, connecting an additional resistor will cause the decrease in the total resistance Ra-b, while disconnecting a resistor will cause the increase in the total resistance Ra-b. Therefore, resistance compensation circuit 20 may determine which of the resistors Rnw_0 through Rnw_n and Rpo_0 through Rpo_n should be connected or disconnected, and control the switching of the corresponding switches PW0 through PWn and SW0 through SWm. Since polysilicon resistors Rpo_0 through Rpo_n have smaller resistance variations than well resistors Rnw_0 through Rnw_m, well resistors may be connected first to coarsely tune the total resistance Ra-b, while polysilicon resistors are then used to fine tune the total resistance Ra-b.

Preferably, to increase the reliability of resistor block 10, a majority portion of the current is designed to flow through coarse well resistors Rnw_0 through Rnw_m, while less current flows through fine polysilicon resistors Rpo_0 through Rpo_n. This may be achieved by increasing the number of well resistors, or making well resistors Rnw_0 through Rnw_n with smaller resistances than polysilicon resistors Rpo_0 through Rpo_n.

In an embodiment, well resistors Rnw_0 through Rnw_m are designed to have identical target resistances, although their actual resistances vary due to process, temperature, and voltage variations. In alternative embodiments, to be able to effectively generate different terminal resistance values out of a same resistance block 10, well resistors Rnw_0 through Rnw_m are separated into several groups, and the well resistors in each of the groups has a different target resistance than the well resistors in other groups. In yet other embodiments, some or all of the well resistors Rnw_0 through Rnw_m have target resistances different from that of other well resistors. Similarly, polysilicon resistors may have the same or different target resistances.

Figure 4:
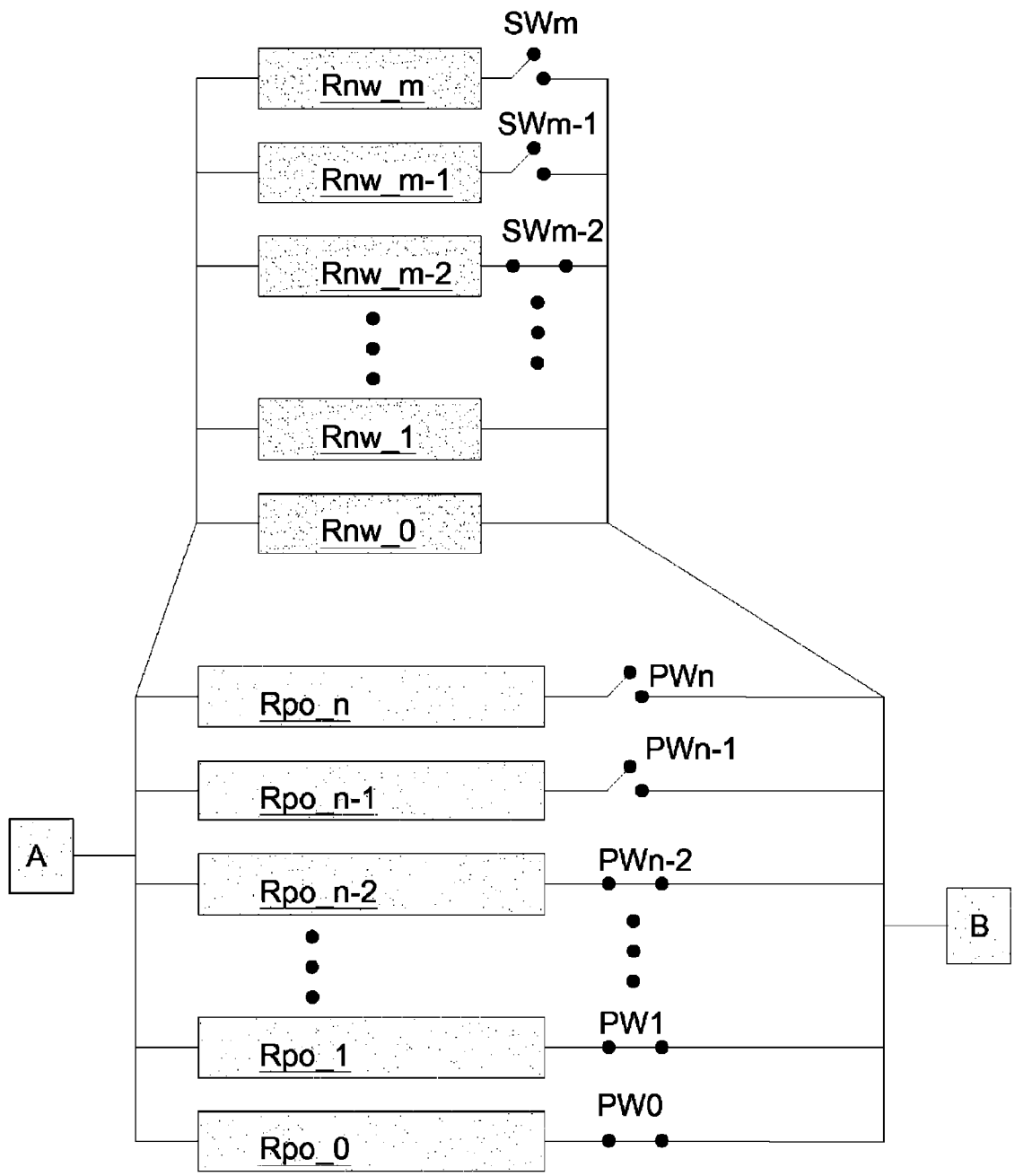
FIG. 4 illustrates another embodiment of the present invention, wherein a portion of the well resistors is not controlled by switches.

FIG. 4 illustrates an alternative embodiment of the present invention, wherein at least one of the resistors, for example, one of the well resistors Rnw_0 through Rnw_m, does not have a connecting switch, and thus is always pre-connected between nodes A and B. Since well resistors have higher process variations than polysilicon resistors, at least some of them can be pre-connected, so that the calibration time for resistance tuning may be reduced. In other embodiments, all well resistors Rnw_0 through Rnw_m do not have connecting switches. In yet other embodiments, only one well resistor Rnw_0 is formed, preferably directly connected between nodes A and B not through a switch, while polysilicon resistors Rpo_0 through Rpo_n have connecting switches, and are used to fine tune the resistance Ra–b.

In the embodiments discussed in the preceding paragraphs, well resistors act as coarse resistors, and polysilicon resistors act as fine resistors. One skilled in the art will realize that the coarse resistors and fine resistors may be formed of different combinations of materials, such as alloys, doped silicon germanium, and the like.

The embodiments of the present invention have several advantageous features. By using coarse resistors with greater Imax/µm, less chip area is used. On the other hand, by using fine resistors, the resistance variations are kept low. Experiments have revealed that compared to on-die terminators formed only of polysilicon resistors, the chip area usage of the embodiments of the present invention may be saved by about 50 percent. The precision of the embodiments of the present invention is at least comparable to, and possibly better than, the precision of all polysilicon on-die terminators. In addition, by using well resistors, the on-die terminators can be shrunk with the down-scaling of integrated circuits by using appropriate combinations of coarse resistors and fine resistors, and by forming deeper wells for the well resistors.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
   a semiconductor substrate;
   a first node;
   a second node;
   a first plurality of resistors, each in a first plurality of resistor units, wherein each of the first plurality of resistor units comprises a first end connected to the first node, and a second end connected to the second node, and wherein none of the first plurality of resistor units comprises a switch;
   a second plurality of resistors, each in a second plurality of resistor units, wherein each of the second plurality of resistor units comprises a first end connected to the first node, and a second end connected to the second node, and wherein the first plurality of resistors is formed of a first material, and the second plurality of resistors is formed of a second material different from the first material; and
   a switch in each of the second plurality of resistor units and serially connected to a resistor in a same resistor unit.

2. The integrated circuit of claim 1, wherein the first plurality of resistors has a greater resistance variation than the second plurality of resistors.

3. The integrated circuit of claim 2, wherein the first plurality of resistors has a greater maximum endurable current per unit width than the second plurality of resistors.

4. The integrated circuit of claim 1, wherein the first plurality of resistors are well resistors formed in the semiconductor substrate, and the second plurality of resistors are polysilicon resistors.

5. The integrated circuit of claim 1 further comprising a resistance compensation circuit coupled to, and controlling a state of, the switch.

6. The integrated circuit of claim 1, wherein each of the first plurality of resistors has a first end directly connected to the first node, and a second end directly connected to the second node.

7. The integrated circuit of claim 1, wherein no two of the first plurality of resistors are serially coupled between the first and the second nodes.

8. An integrated circuit comprising:
   a semiconductor substrate;
   a first node;
   a second node;
   a well resistor in the semiconductor substrate, wherein the well resistor has a first end directly connected to the first node, and a second end directly connected to the second node;
   a plurality of polysilicon resistors, each of the plurality of polysilicon resistors having a first end connected to the first node, and a second end; and
   a plurality of switches, each coupled between the first end of one of the plurality of polysilicon resistors and the second node.

9. The integrated circuit of claim 8 further comprising an additional well resistor having a first end directly connected to the first node, and a second end directly connected to the second node.

10. The integrated circuit of claim 8 further comprising:
an additional well resistor; and
an additional switch serially connected to the additional well resistor, wherein the additional well resistor and the additional switch are coupled between the first and the second nodes.

11. The integrated circuit of claim 8, wherein all well resistors coupled between the first and the second nodes are directly connected to the first and the second nodes.

12. The integrated circuit of claim 8 further comprising a resistance compensation circuit coupled to, and controlling states of, the plurality of switches.

13. The integrated circuit of claim 8, wherein no two of the plurality of polysilicon resistors are serially coupled between the first and the second nodes.

* * * * *